(12) United States Patent
Zhang

(10) Patent No.: US 10,797,120 B2
(45) Date of Patent: Oct. 6, 2020

(54) ARRAY SUBSTRATE, FABRICATION METHOD THEREOF, AND DISPLAY DEVICE

(71) Applicant: Wuhan China Star Optoelectronics Semiconductor Display Technology Co., Ltd., Wuhan (CN)

(72) Inventor: Xingyong Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,289

(22) PCT Filed: Nov. 22, 2018

(86) PCT No.: PCT/CN2018/116960
§ 371 (c)(1),
(2) Date: Jul. 7, 2019

(87) PCT Pub. No.: WO2020/082481
PCT Pub. Date: Apr. 30, 2020

(65) Prior Publication Data
US 2020/0185468 A1    Jun. 11, 2020

(30) Foreign Application Priority Data
Oct. 23, 2018   (CN) .......................... 2018 1 1239811

(51) Int. Cl.
*H01L 27/32*   (2006.01)
*H01L 51/52*   (2006.01)
*H01L 51/56*   (2006.01)

(52) U.S. Cl.
CPC ...... *H01L 27/3246* (2013.01); *H01L 27/3276* (2013.01); *H01L 51/5225* (2013.01);
(Continued)

(58) Field of Classification Search
CPC ............. H01L 27/3246; H01L 27/3276; H01L 51/5225; H01L 51/5253; H01L 51/56; H01L 2227/323
(Continued)

(56) References Cited

U.S. PATENT DOCUMENTS

2015/0228927 A1* 8/2015 Kim ................... H01L 51/5203
257/40
2016/0099432 A1   4/2016 Kim et al.
(Continued)

FOREIGN PATENT DOCUMENTS

CN    104701461    6/2015
CN    106469742    3/2017
(Continued)

*Primary Examiner* — Tong-Ho Kim

(57) ABSTRACT

In an embodiment, an array substrate includes a substrate having a display region and a package region surrounding the display region, wherein the display region comprises a side region adjacent to the package region; a pixel definition layer disposed on the display region of the substrate, wherein the pixel definition layer is formed with a plurality of recesses and a plurality of corresponding protrusions surrounding each recess, and each recess and each protrusion correspond to the side region; and a cathode trace disposed on a surface of each protrusion and a bottom surface of each recess, wherein a gap exists between the cathode trace on each protrusion and the cathode trace in each recess.

16 Claims, 2 Drawing Sheets

(52) U.S. Cl.
CPC .......... *H01L 51/5253* (2013.01); *H01L 51/56* (2013.01); *H01L 2227/323* (2013.01)

(58) Field of Classification Search
USPC .......................................................... 257/40
See application file for complete search history.

(56) References Cited

U.S. PATENT DOCUMENTS

| | | |
|---|---|---|
| 2017/0117337 A1 | 4/2017 | Kimura et al. |
| 2017/0338293 A1* | 11/2017 | Guo .................... H01L 27/3267 |
| 2018/0301521 A1 | 10/2018 | Yang |
| 2019/0326370 A1 | 10/2019 | Lu |

FOREIGN PATENT DOCUMENTS

| | | |
|---|---|---|
| CN | 106876331 | 6/2017 |
| CN | 108364987 | 8/2018 |
| CN | 108538890 | 9/2018 |
| JP | 2016-085796 | 5/2016 |

\* cited by examiner

ARRAY SUBSTRATE, FABRICATION METHOD THEREOF, AND DISPLAY DEVICE

RELATED APPLICATIONS

This application is a National Phase of PCT Patent Application No. PCT/CN2018/116960 having International filing date of Nov. 22, 2018, which claims the benefit of priority of Chinese Patent Application No. 201811239811.1 filed on Oct. 23, 2018. The contents of the above applications are all incorporated by reference as if fully set forth herein in their entirety.

FIELD AND BACKGROUND OF THE INVENTION

The present disclosure relates to a technical field of flexible liquid crystal displays, and more particularly to an array substrate, a fabrication method thereof, and a display device.

Organic light-emitting diode (OLED) display screens are display screens fabricated using organic electroluminescent diodes. Because of simultaneously having excellent properties such as having self-luminous organic electroluminescent diodes, no backlights, high contrasts, thin thicknesses, wide viewing angles, and fast responses, being applicable to flexible displays, having wide operating temperature ranges, and simpler structures and fabrication processes, OLED display screens are considered as emerging application technologies of next generation flat panel displays.

Compared with liquid crystal displays, active-matrix organic light-emitting diodes (AMOLEDs) have high contrasts, wide viewing angles, high moving image response speed, etc., and therefore have attracted attention and development of people. AMOLEDs are one type of OLEDs.

With expansion of OLED application fields, new application fields require full screens of flexible OLED displays more. Full screens of flexible OLED displays have more and more requirements such as OLED display bending life and slim borders. Narrowing lower borders in OLED display borders is researched more, but also brings more problems. Among them, package failures are the most direct risks brought by narrowed lower borders.

In order to reduce package failures brought by narrowed lower borders, a patent application No. US20180069194 of Apple Inc. published in 2018 proposes to change a pixel defining layer near a periphery from being continuous to being discontinuous. A cathode trace is bounded to be on an inner side by an inner opening, to prevent the cathode trace from being affected by film formation deviation which causes the cathode trace to be too close to package film layers. An outer opening is filled by an inorganic layer, enhancing water and oxygen barrier performance of a side and preventing the cathode trace from being corroded.

However, narrowed lower borders bring a problem. That is, cathode traces are hard to be encapsulated by inorganic package layers. There are also other problems that are difficult to solve. For example, a pixel region closer to a package region is more easily to be invaded by water vapor, causing a light-emitting material to fail. When a pixel region is closer to a retaining wall, because an organic package film has fluidity, it is hard for the retaining wall to block the organic film layer, resulting in a package failure caused by overflow of the organic layer. Modifying OLED structures to solve such problems are currently hot research topics.

SUMMARY OF THE INVENTION

Problems of the present disclosure are as follows. Narrowed lower borders bring a problem. That is, cathode traces are hard to be encapsulated by inorganic package layers. There are also other problems that are difficult to solve. For example, a pixel region closer to a package region is more easily to be invaded by water vapor, causing a light-emitting material to fail. When a pixel region is closer to a retaining wall, because an organic package film has fluidity, it is hard for the retaining wall to block the organic film layer, resulting in a package failure caused by overflow of the organic layer.

An object of the present disclosure is to provide an array substrate, a fabrication method thereof, and a display device. By recessing a pixel definition layer and filling a design, to form a plurality of trapezoidal openings and a plurality of trapezoidal protrusions, the following technical problems of the related art are solved. In the related art, the pixel region closer to the package region is more easily to be invaded by water vapor, causing the light-emitting material to fail. When the pixel region is closer to the retaining wall, because the organic package film has fluidity, it is hard for the retaining wall to block the organic film layer, resulting in the package failure caused by the overflow of the organic layer.

In order to solve the aforementioned problems, the present disclosure provides an array substrate including: a substrate having a display region and a package region surrounding the display region, wherein the display region includes a side region adjacent to the package region; a pixel definition layer disposed on the display region of the substrate, wherein the pixel definition layer is formed with a plurality of recesses and a plurality of protrusions surrounding each recess, and each recess and each protrusion correspond to the side region; and a cathode trace disposed on a surface of each protrusion and a bottom surface of each recess, wherein a gap exists between the cathode trace on each protrusion and the cathode trace in each recess.

Further, each recess has a shape of a trapezoid, each protrusion has a shape of an inverted trapezoid, a thickness of the cathode trace is smaller than a depth of each recess, and the depth of each recess is 200-300 nm.

Further, the array substrate further includes an organic elevation layer disposed between the cathode trace and each protrusion.

Further, the organic elevation layer has a shape of a plurality of trapezoids, a thickness of the organic elevation layer is 1 um, and a material of the organic elevation layer is acrylic or polyimide.

The present disclosure also provides a method for fabricating an array substrate, including: a recessing step including: providing a substrate having a display region and a package region surrounding the display region, wherein the display region includes a side region adjacent to the package region; forming a pixel definition layer on the display region of the substrate; and recessing the pixel definition layer, to form a plurality of recesses and a plurality of protrusions adjacent to each recess, and each recess and each protrusion correspond to the side region; and a cathode trace forming step including: forming a light-emitting layer on the display region of the substrate and forming a cathode trace on a surface of the light-emitting layer, a surface of each protrusion, and a bottom surface of each recess, wherein a gap exists between the cathode trace on each protrusion and the cathode trace in each recess.

Further, in between the recessing step and the cathode trace forming step, the method further includes: an organic elevation layer forming step including: forming an organic elevation layer on each protrusion; wherein in the cathode trace forming step, the cathode trace corresponding to each protrusion is disposed on a surface of the organic elevation layer.

Further, after the cathode trace forming step, the method further includes: a first organic layer filling step including: filling a first organic substance in each recess, to form a first organic layer such that a surface of the first organic layer is flush with a surface of each protrusion.

Further, after the first organic layer filling step, the method further includes: a packaging step including: a first inorganic layer forming step of covering a surface of the cathode trace and the surface of the first organic layer with a first inorganic layer; a second organic layer forming step of forming a second organic layer on the first inorganic layer; and a second inorganic layer forming step of forming a second inorganic layer on the second organic layer.

Further, in the step of providing the substrate, the substrate further has a retaining wall, and the retaining wall is located adjacent to the package region.

The present disclosure also provides a display device using any of the aforementioned array substrates.

Advantages of an array substrate, a fabrication method thereof, and a display device of the present disclosure are as follows. A pixel definition layer is formed with a plurality of openings and a plurality of protrusions. The structure causes a cathode trace on the pixel definition layer to be discontinuous. Even if the cathode trace at an edge is corroded, the cathode trace inside a pixel region is not affected. Using exposure, development, and coating, a plurality of trapezoidal openings are formed in a pixel definition layer, and a plurality of trapezoidal protrusions are formed on the pixel definition layer. During packaging, the trapezoidal openings and the trapezoidal protrusions may lengthen a water and oxygen invasion path, enhancing water and oxygen barrier performance of a side of the device, and simultaneously increasing difficulty for an organic package layer to flow out of a retaining wall and decreasing a risk of overflow of the organic package layer.

BRIEF DESCRIPTION OF THE SEVERAL VIEWS OF THE DRAWINGS

In order to describe a technical solution in embodiments more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

Figure 1:
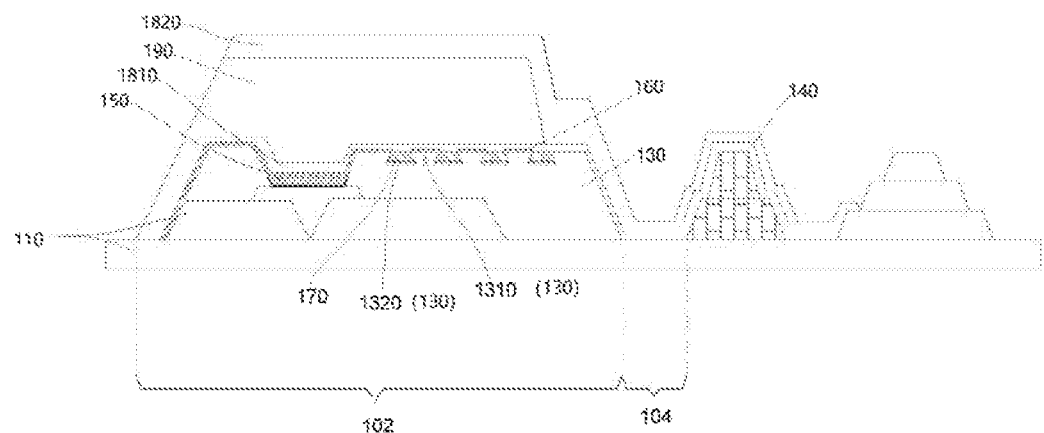
FIG. 1 is a schematic side-view diagram of an array substrate in accordance with a first embodiment.

Components in the drawings are denoted as follows.

| 100 display device; | |
| 10 array substrate; | 20 color film substrate; |
| 110 substrate; | |
| 102 display region; | 104 package region; |
| 130 pixel definition layer; | 140 retaining wall; |
| 150 light-emitting layer; | 160 cathode trace; |

-continued

| 170 first organic layer; | |
| 1810 first inorganic layer; | 1820 second inorganic layer; |
| 190 second organic layer; | |
| 1310 protrusion; | 1320 recess; |
| 1330 organic elevation layer; | |

DESCRIPTION OF SPECIFIC EMBODIMENTS OF THE INVENTION

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "top", "bottom", etc., are only directions by referring to the accompanying drawings, and thus the used directional terms are used to describe and understand the present disclosure, but the present disclosure is not limited thereto.

First Embodiment

As illustrated in FIG. 1, an array substrate 10 of the first embodiment includes a substrate 110, a pixel definition layer 130, a retaining wall 140, a light-emitting layer 150, a cathode trace 160, a first organic layer 170, a first inorganic layer 1810, a second inorganic layer 1820, and a second organic layer 190. The pixel definition layer 130 includes a plurality of protrusions 1310 and a plurality of recesses 1320.

The substrate 110 includes a display region 102 and a package region 104 surrounding the display region 102.

The pixel definition layer 130 is disposed on the display region 102, and is discontinuous, thereby preventing package failures brought by narrowed lower borders. However, because a pixel region is closer to the package region 104 and the retaining wall 140, the pixel region is more easily to be invaded by water vapor, causing a light-emitting material to fail. Also, because an organic package film has fluidity, it is hard for the retaining wall 140 to block the organic film, resulting in a package failure caused by overflow of the organic layer. Therefore, the recesses 1320 are formed in the pixel definition layer 130 closer to the package region 104, which causes the protrusions 1310 to be formed.

Each of the protrusions 1310 surrounding the recesses 1320 has a shape of an inverted trapezoid. Each recess 1320 has a shape of a trapezoid. A depth of each recess 1320 is 200-300 nm, ensuring that the depth of each recess 1320 is larger than a thickness of the cathode trace 160. When each recess 1320 is filled with the first organic layer 170, the first organic layer 170 fills each recess 1320 such that a surface of the first organic layer 170 is flush with a surface of each protrusion 1310.

The light-emitting layer 150 is defined by the pixel definition layer 130, and the cathode trace 160 is formed on a surface of the light-emitting layer 150. Because the pixel definition layer 130 is discontinuous, and is formed with the protrusions 1310 and the recesses 1320, the cathode trace 160 on the pixel definition layer 130 is also discontinuous. In this way, even if the cathode trace 160 at an edge is corroded, the cathode trace 160 inside a pixel region is not affected.

The present disclosure also provides a method for fabricating the aforementioned array substrate, including: a recessing step, a cathode trace forming step, a first organic layer filling step, and a packaging step.

The recessing step includes providing the substrate 110; forming the pixel definition layer 130 on the substrate 110; recessing the pixel definition layer 130 using exposure and development, to form the recesses 1320 and the protrusions 1310 adjacent to each recess 1320.

The cathode trace forming step includes forming the light-emitting layer 150 in the pixel region and forming the cathode trace 160 on a surface of the light-emitting layer 150, using a thermal evaporation process.

The first organic layer filling step includes forming the first organic layer 170 on a surface of the cathode trace 160 in each recess 1320 using a thermal evaporation process. The first organic layer 170 fills each recess 1320.

The packaging step includes forming the first inorganic layer 1810 on a surface of the cathode trace 160 and the surface of the first organic layer 170 using vapor deposition; forming the second organic layer 190 on the first inorganic layer 1810 using an inkjet printing process; and then forming the second inorganic layer 1820 on the second organic layer 190 using vapor deposition. In this way, a thin film package is formed on a surface of the device.

In the packaging step, a material of the first inorganic layer 1810 and a material of the second inorganic layer 1820 formed by the vapor deposition may be silicon nitride, silicon oxynitride, or the like. A material of the second organic layer 190 formed by the inkjet printing process may be acrylic.

Second Embodiment

Figure 2:
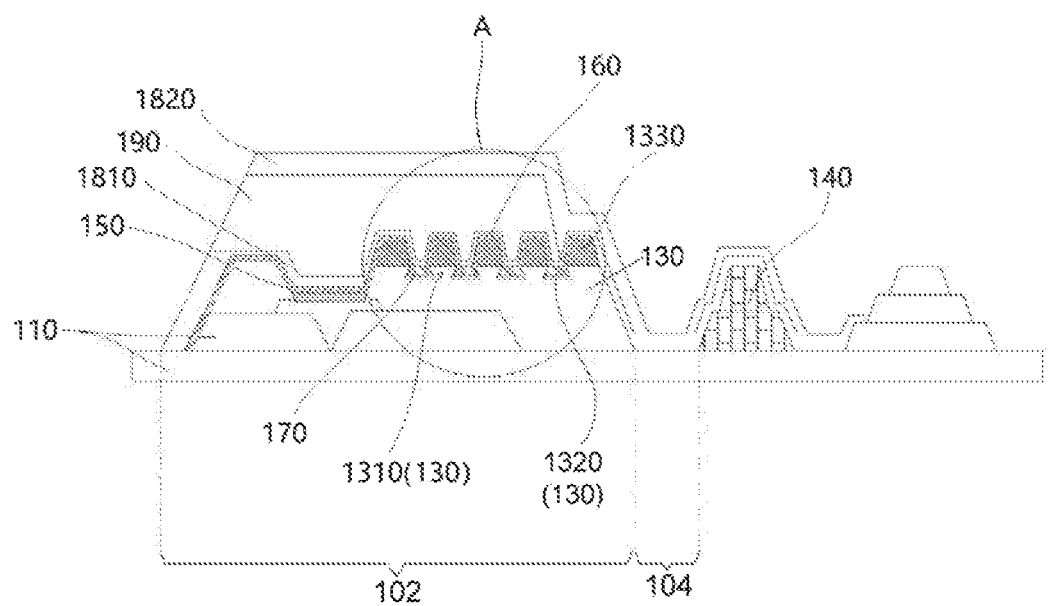
FIG. 2 is a schematic side-view diagram of an array substrate in accordance with a second embodiment.
Figure 3:
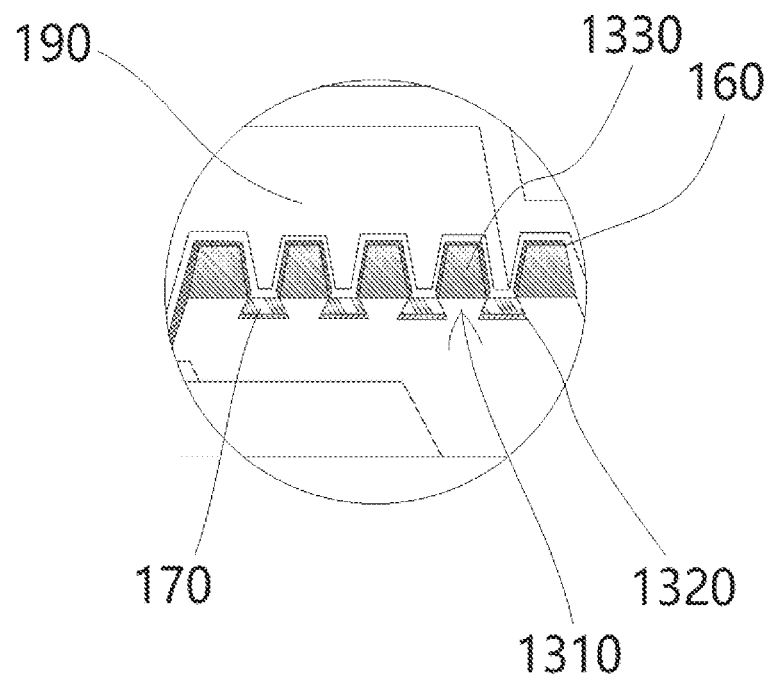
FIG. 3 is an enlarged-view diagram of a circled portion A in FIG. 2.
Figure 4:
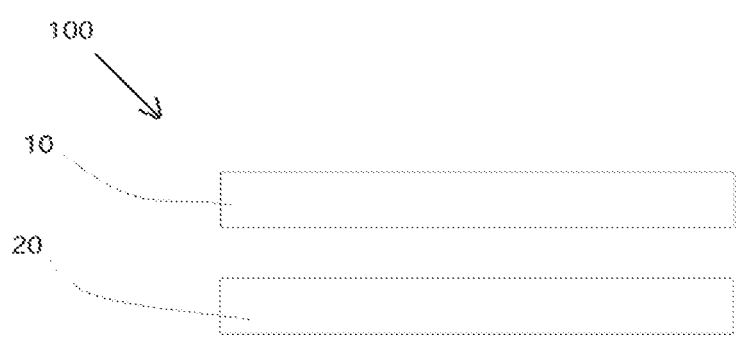
FIG. 4 is a schematic diagram of a display device in accordance with an embodiment.

As illustrated in FIG. 2, an array substrate 10 of the second embodiment includes a substrate 110, a pixel definition layer 130, a retaining wall 140, a light-emitting layer 150, a cathode trace 160, a first organic layer 170, a first inorganic layer 1810, a second inorganic layer 1820, and a second organic layer 190. The pixel definition layer 130 includes a plurality of protrusions 1310 and a plurality of recesses 1320.

The substrate 110 includes a display region 102 and a package region 104 surrounding the display region 102.

The pixel definition layer 130 is disposed on the display region 102, and is discontinuous, thereby reducing package failures brought by narrowed lower borders. However, because a pixel region is closer to the package region 120 and the retaining wall 140, the pixel region is more easily to be invaded by water vapor, causing a light-emitting material to fail. Also, because an organic package film has fluidity, it is hard for the retaining wall 140 to block the organic film, resulting in a package failure caused by overflow of the organic layer. Therefore, the recesses 1320 are formed in the pixel definition layer 130, which causes the protrusions 1310 to be formed.

The above structure is same as a structure in the first embodiment. A difference between the first embodiment and the second embodiment is that the array substrate 10 in the present embodiment further includes an organic elevation layer 1330.

The organic elevation layer 1330 is formed on each protrusion 1310. The organic elevation layer 1330 has a shape of a plurality of trapezoids. Each longer bottom side of the organic elevation layer 1330 is coincided with a longer bottom side of each protrusion 1310. A purpose of a trapezoidal design is to more stably form the organic elevation layer 1330 on each protrusion 1310. Also, the organic elevation layer 1330 may serve as retaining walls which may block the organic layer during packaging. The package failure caused by insufficient capability for blocking the package by the retaining wall 140 is prevented.

Each of the protrusions 1310 surrounding the recesses 1320 has a shape of an inverted trapezoid. Each recess 1320 has a shape of a trapezoid. A depth of each recess 1320 is 200-300 nm, ensuring that the depth of each recess 1320 is larger than a thickness of the light-emitting layer 150 and the cathode trace 160. When each recess 1320 is filled with the first organic layer 170, the first organic layer 170 fills each recess 1320 such that a surface of the first organic layer 170 is flush with a surface of each protrusion 1310.

The light-emitting layer 150 is defined by the pixel definition layer 130, and the cathode trace 160 is formed on a surface of the light-emitting layer 150. Because the pixel definition layer 130 is discontinuous, has the organic elevation layer 1330 formed thereon, and is formed with the recesses 1320, the cathode trace 160 on the pixel definition layer 130 is also discontinuous. In this way, even if the cathode trace 160 at an edge is corroded, the cathode trace 160 inside a pixel region is not affected. The present disclosure also provides a method for fabricating the aforementioned array substrate, including: a recessing step, a cathode trace forming step, an organic elevation layer forming step, a first organic layer filling step, and a packaging step.

The recessing step includes providing the substrate 110; forming the pixel definition layer 130 on the substrate 110; recessing the pixel definition layer 130 using exposure and development, to form the recesses 1320 and the protrusions 1310 adjacent to each recess 1320.

The cathode trace forming step includes forming the light-emitting layer 150 in the pixel region and forming the cathode trace 160 on a surface of the light-emitting layer 150, using a thermal evaporation process.

The organic elevation layer forming step includes forming the organic elevation layer 1330 on each protrusion 1310.

In the cathode trace forming step, the cathode trace 160 corresponding to each protrusion 1310 is disposed on a surface of the organic elevation layer 1330.

The first organic layer filling step includes forming the first organic layer 170 on a surface of the cathode trace 160 in each recess 1320 using a thermal evaporation process. The first organic layer 170 fills each recess 1320.

The packaging step includes forming the first inorganic layer 1810 on a surface of the cathode trace 160 and the surface of the first organic layer 170 using vapor deposition; forming the second organic layer 190 on the first inorganic layer 1810 using an inkjet printing process; and then forming the second inorganic layer 1820 on the second organic layer 190 using vapor deposition. In this way, a thin film package is formed on a surface of the device.

In the packaging step, a material of the first inorganic layer 1810 and a material of the second inorganic layer 1820 formed by the vapor deposition may be silicon nitride, silicon oxynitride, or the like. A material of the second organic layer 190 formed by the inkjet printing process may be acrylic.

The present disclosure also provides a display device. Main improvement points and features of the display device 100 are collectively embodied on the array substrate 10. Other components of the display device 100 such as a color film substrate 20 are omitted for brevity.

The above are only the preferred embodiments of the present disclosure, and are not intended to limit the present disclosure. Any modifications, equivalent alternatives, and improvements made within the spirit and the principles of present disclosure should be included in the protection scope of the present disclosure.

What is claimed is:

1. An array substrate, comprising:
   a substrate having a display region and a package region surrounding the display region, wherein the display region comprises a side region adjacent to the package region;
   a pixel definition layer disposed on the display region of the substrate, wherein the pixel definition layer is formed with a plurality of recesses and a plurality of protrusions surrounding each recess, and each recess and each protrusion correspond to the side region; and
   a cathode trace disposed on a surface of each protrusion and a bottom surface of each recess, wherein a gap exists between the cathode trace on each protrusion and the cathode trace in each recess, and there is no light-emitting layer in any of the recesses.

2. The array substrate of claim 1, wherein each recess has a shape of a trapezoid, each protrusion has a shape of an inverted trapezoid, a thickness of the cathode trace is smaller than a depth of each recess, and the depth of each recess is 200-300 nm.

3. A display device, comprising: the array substrate of claim 2.

4. The array substrate of claim 1, further comprising:
   an organic elevation layer disposed between the cathode trace and each protrusion.

5. A display device, comprising: the array substrate of claim 4.

6. The array substrate of claim 4, wherein the organic elevation layer has a shape of a plurality of trapezoids, a thickness of the organic elevation layer is 1 um, and a material of the organic elevation layer is acrylic or polyimide.

7. A display device, comprising: the array substrate of claim 6.

8. A display device, comprising: the array substrate of claim 1.

9. A method for fabricating an array substrate, comprising:
   a recessing step comprising:
      providing a substrate having a display region and a package region surrounding the display region, wherein the display region comprises a side region adjacent to the package region;
      forming a pixel definition layer on the display region of the substrate; and
      recessing the pixel definition layer, to form a plurality of recesses and a plurality of protrusions adjacent to each recess, and each recess and each protrusion correspond to the side region; and
   a cathode trace forming step comprising:
      forming a light-emitting layer on the display region of the substrate and forming a cathode trace on a surface of the light-emitting layer, a surface of each protrusion, and a bottom surface of each recess, wherein a gap exists between the cathode trace on each protrusion and the cathode trace in each recess, and there is no light-emitting layer in any of the recesses.

10. The method for fabricating the array substrate of claim 9, wherein in between the recessing step and the cathode trace forming step, the method further comprises:
    an organic elevation layer forming step comprising:
       forming an organic elevation layer on each protrusion;
    wherein in the cathode trace forming step, the cathode trace corresponding to each protrusion is disposed on a surface of the organic elevation layer.

11. The method for fabricating the array substrate of claim 10, wherein after the cathode trace forming step, the method further comprises:
    a first organic layer filling step comprising:
       filling a first organic substance in each recess, to form a first organic layer such that a surface of the first organic layer is flush with a surface of each protrusion.

12. The method for fabricating the array substrate of claim 11, wherein after the first organic layer filling step, the method further comprises:
    a packaging step comprising:
       a first inorganic layer forming step of covering a surface of the cathode trace and the surface of the first organic layer with a first inorganic layer;
       a second organic layer forming step of forming a second organic layer on the first inorganic layer; and
       a second inorganic layer forming step of forming a second inorganic layer on the second organic layer.

13. The method for fabricating the array substrate of claim 9, wherein after the cathode trace forming step, the method further comprises:
    a first organic layer filling step comprising:
       filling a first organic substance in each recess, to form a first organic layer such that a surface of the first organic layer is flush with a surface of each protrusion.

14. The method for fabricating the array substrate of claim 13, wherein after the first organic layer filling step, the method further comprises:
    a packaging step comprising:
       a first inorganic layer forming step of covering a surface of the cathode trace and the surface of the first organic layer with a first inorganic layer;
       a second organic layer forming step of forming a second organic layer on the first inorganic layer; and
       a second inorganic layer forming step of forming a second inorganic layer on the second organic layer.

15. The method for fabricating the array substrate of claim 9, wherein in the step of providing the substrate, the substrate further has a retaining wall, and the retaining wall is located adjacent to the package region.

16. A display device, comprising: the array substrate fabricated by the method of claim 9.

* * * * *